(12) United States Patent
Britt, Jr.

(10) Patent No.: US 8,490,146 B2
(45) Date of Patent: Jul. 16, 2013

(54) DUAL MODE PROXIMITY SENSOR

(75) Inventor: Joe Freeman Britt, Jr., Los Altos, CA (US)

(73) Assignee: Google Inc., Mountain View, CA (US)

( * ) Notice: Subject to any disclaimer, the term of this patent is extended or adjusted under 35 U.S.C. 154(b) by 4 days.

(21) Appl. No.: 13/286,999

(22) Filed: Nov. 1, 2011

(65) Prior Publication Data

US 2013/0107129 A1 May 2, 2013

(51) Int. Cl.
*H04N 7/16* (2011.01)

(52) U.S. Cl.
USPC ............... 725/141; 725/10; 725/12; 725/15

(58) Field of Classification Search
USPC .......................................... 725/10, 12, 15, 141
See application file for complete search history.

(56) References Cited

U.S. PATENT DOCUMENTS

| 4,893,852 | A | 1/1990 | Harris et al. |
|---|---|---|---|
| 2009/0073313 | A1 | 3/2009 | Liu |
| 2009/0079813 | A1* | 3/2009 | Hildreth ..................... 348/14.03 |
| 2009/0153288 | A1 | 6/2009 | Hope et al. |
| 2010/0019922 | A1 | 1/2010 | Van Loenen et al. |
| 2010/0188248 | A1 | 7/2010 | Sultan et al. |
| 2010/0214214 | A1* | 8/2010 | Corson et al. ................. 345/158 |
| 2011/0157029 | A1 | 6/2011 | Tseng |

OTHER PUBLICATIONS

International Search Report and Written Opinion in International Application No. PCT/US2012/057742, mailed Jan. 21, 2013, 12 pages.

\* cited by examiner

*Primary Examiner* — Kieu Oanh T Bui (74) *Attorney, Agent, or Firm* — Fish & Richardson P.C.

(57) ABSTRACT

A computer-implemented method for controlling an electronic device including receiving a signal through a light sensor of the device, identifying with a processor of the device whether the received signal originated from a light emitter of the device, and controlling a function of the device, the function selected based on whether the signal is identified as originating from the light emitter of the device or the light emitter separate from the device.

20 Claims, 6 Drawing Sheets

DUAL MODE PROXIMITY SENSOR

TECHNICAL FIELD

This document generally describes sensors in consumer electronic devices.

BACKGROUND

Set-top boxes are commonly used for interfacing consumer devices with satellite, cable, and Internet providers. Such set-top boxes can also be employed to provide services such as Internet radio, electronic television programming, media streaming, and online gaming functionality. Each service generally provides integration between users and digital data. Providing such integrative access to users has led the industry to develop robust electronic products which enable users to interact with services provided by such devices in a natural fashion. Similar functionality can also be provided in televisions themselves, and in various other consumer electronics devices, such as home theatre and stereo receivers, docking stations, and the like.

It is common to permit remote control of a consumer electronic device using a handheld control that emits electromagnetic energy, such as a pulsed infrared signal, sensing the signal at the device, and interpreting the received signal to identify an action the device is to take, such as to change the channel of a tuner, or alter the volume of a television or stereo system.

SUMMARY

This document describes techniques for controlling an electronic device. In general, a sensor on a consumer electronic device can be positioned on the device to receive signals from an electronic remote control in a familiar manner. An emitter of energy, such as an IR emitter, can be located close to the sensor but positioned so that energy from the emitter does not normally impinge on the sensor. When a user moves an item like their hand in front of the emitter and the sensor, the energy can reflect off the item and be sensed by the sensor. The device may then be programmed to differentiate such energy sensed from the internal device emitter, as compared to energy sensed from a remote control, and may perform an action that is different than actions that are performed in response to receiving signals from the remote control. For example, the "reflective" energy situation may be used to turn the device on or off, or to mute it. Thus, if a user is watching television and the telephone rings, but the user cannot find the remote control, the user could simply pass her hand past the front of her home theatre receiver or her television in order to mute its sound. Other more complex actions may be triggered using the remote control (once the user has found it).

As an extension of this principle, a device may be provided with multiple emitters and multiple sensors so that reflective control can be used for more than one action. For example, an emitter/sensor pair may be placed in each of the lower corners of a television bezel, so that placing a hand or object in front of one corner mutes or unmutes the television, and placing a hand or object in front of the other corner turns the television on or off. In certain circumstances, a single energy generator may serve multiple emitters, such as by providing a single LED in an A/V receiver, and guiding the light from the LED to two different locations on the face of the receiver (both being adjacent to separate IR sensors) via optical fibers.

The techniques and systems discussed here may, in appropriate implementations, provide one or more technical advantages. For example, an electronic device may be controlled by two different modes. One such mode (e.g., passing a hand past the device) may be simple with limited applicability while the other may be more complex but also more flexible (e.g., finding and using a remote control). In certain instances, such control may be provided with sensors and associated circuitry and software that would have been provided with a device in any event so as to provide remote control functionality. Thus, the additional functionality may be added to a design with minimal additional cost or need for design. As a result, a buyer of such a device may be able to obtain improved interactivity and user experience with the device, using intuitive interface concepts, and without much additional cost.

In one implementation, A computer-implemented method for controlling an electronic device is disclosed. The method comprises receiving a signal through a light sensor of the device; identifying with a processor of the device whether the received signal originated from a light emitter of the device; and controlling a function of the device, the function selected based on whether the signal is identified as originating from the light emitter of the device or from the light emitter that is separate from the device. The method can also include decoding the received signal based on whether the signal is identified as originating from the light emitter of the device or instead from a light emitter that is separate from the device. Also, identifying can comprise determining whether or not a light reflection is received at an input of the light emitter of the device, and controlling a function of the device can comprise muting or unmuting sound that is caused by the device to be generated. In some aspects, controlling a function of the device comprises changing a television channel using the device.

In another implementation, an electronic device has an electronic control system that comprises a light emitter that is part of the electronic device; a light sensor that is part of the electronic device; and a controller in the electronic device that is programmed to obtain signals from the light sensor and to select a function to be performed by the device, wherein selecting the function to be performed depends on a determination of whether an input to the light sensor was produced by the light emitter. The light emitter can generate infrared light, and the light sensor can comprise an infrared sensor. In addition, the controller can be programmed to determine that the input to the light sensor was produced by the light emitter by determining that a characteristic of the input matches one or more known characteristic for standard infrared light emitters. Moreover, the output for the light emitter can be located physically adjacent an input for the light sensor such that if a user physically covers the light emitter with a hand, light from the emitter will be reflected off the user to the input for the light sensor. In certain aspects, the light emitter comprises a light emitting diode positioned and controlled to provide visual information to a user of the device, and to emit light to be detected by the light sensor.

In yet other aspects, the light emitting diode is connected to a light pipe that extends from the light emitting diode to a location where a user can view light form the light emitting diode. Also, the sensing location can comprise a location on the device where a user can place an object to create a reflection of light from the light emitting diode to be sensed by the light sensor. Moreover, a processor that receives information form the light sensor can be programmed to distinguish between signals from two or more different electronic devices.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

In general, consumer electronics designers wish to ensure products interact in an expected manner when engaged by a user. Thus, the majority of electronic devices are designed to receive input signals from one or more sources and to translate those input signals into an expected output. The input can be entered by users or machines and any corresponding output to such inputs can be provided as information, provided as an input to another entity, or stored for later use. During a design phase for electronic device conception, input mechanisms are generally contemplated by designers for purposes of designing a product which reacts in an expected manner.

Expected device output and/or device operation can be easily determined for responses to traditional input mechanisms such as remote controller input, switching device toggle input, press-button input, etc. Other less traditional inputs for electronic devices, including but not limited to human gesture input, haptic touch input, or wireless non-contact input are not as easily detected or translated into device operation.

Designing products that allow a combination of detecting traditional input and detecting non-traditional input in one device may enable users and designers more options for interfacing with such products in a natural way. Products can be designed to allow or disallow device functionality based on which type of input is received on the device. Specifically, the input type can dictate how the product reacts to the user or electronic input. For example, a stereo receiver, which ordinarily is designed to receive commands from a remote control, may use the same infrared sensor for detecting a remote control signal (i.e., function as a remote decoder) while also detecting a user's proximity to the sensor. That is, the same sensor can be programmed to determine whether a particular input is received from the remote control or a user passing an object in front of the device near or on a touch sensor, for example, and thus reflecting light provided by an emitter that is adjacent to the sensor.

Such a sensor can use one or both inputs to enable or disable specific functionality within the device. For example, using the stereo receiver discussed above, an infrared sensor on the receiver can detect that a user is proximate to the receiver or a sensor on the receiver and may mute the stereo receiver upon detecting the user's proximity. Therefore, in addition to receiving commands from a remote controller at a sensor, for example, the stereo receiver may detect when a user is proximate to the device and can enable or disable specific functionality based on the proximity using the same sensor.

Advantageously, the described systems in this disclosure may provide for one or more benefits, such as enabling users to interact with device sensors using multiple input mechanisms. These are some illustrative examples of how electronic products may interact with a received sensor input. Many different features can be realized using sensors and sensor input, and those described above are not limiting to the scope of what is described below.

Figure 1A:
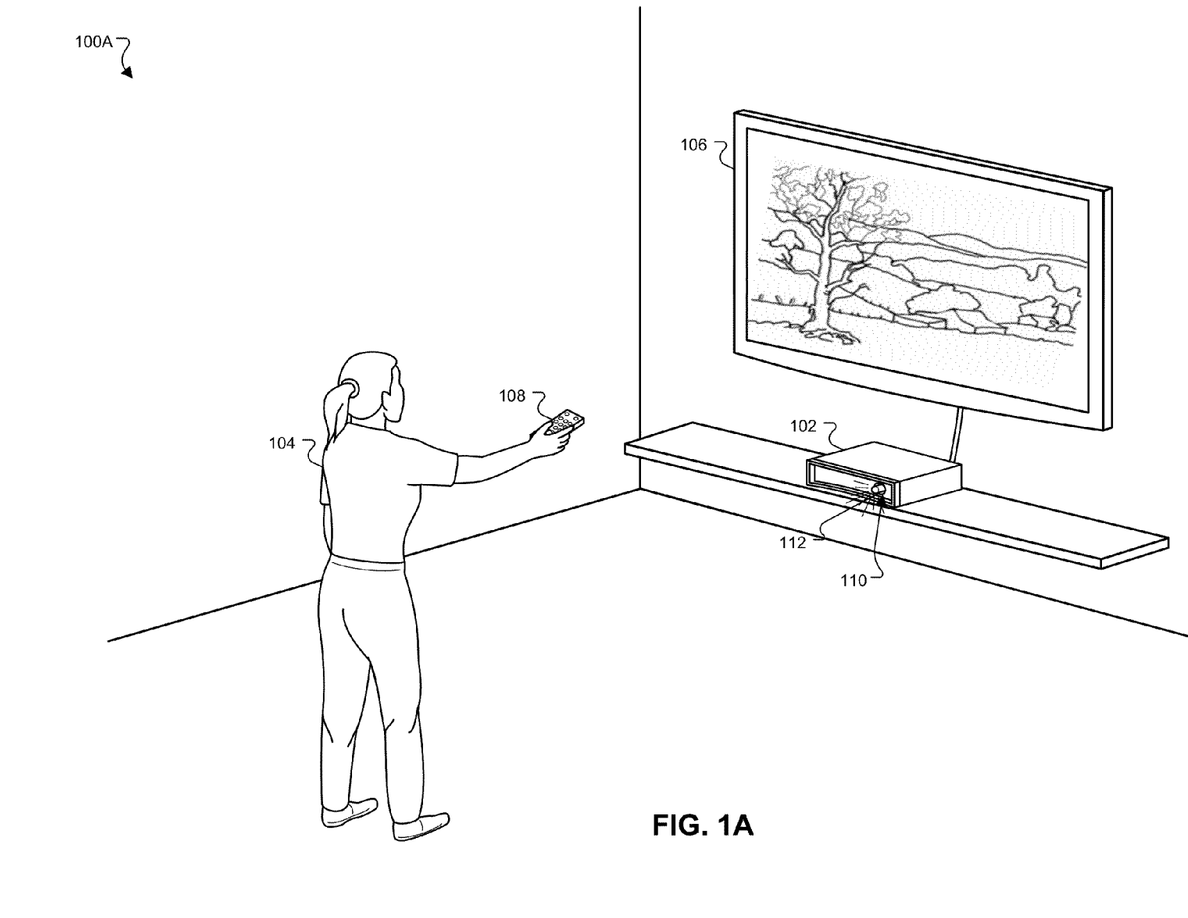
FIGS. 1A and 1B illustrate a conceptual diagram of an environment for controlling an electronic device.
Figure 1B:
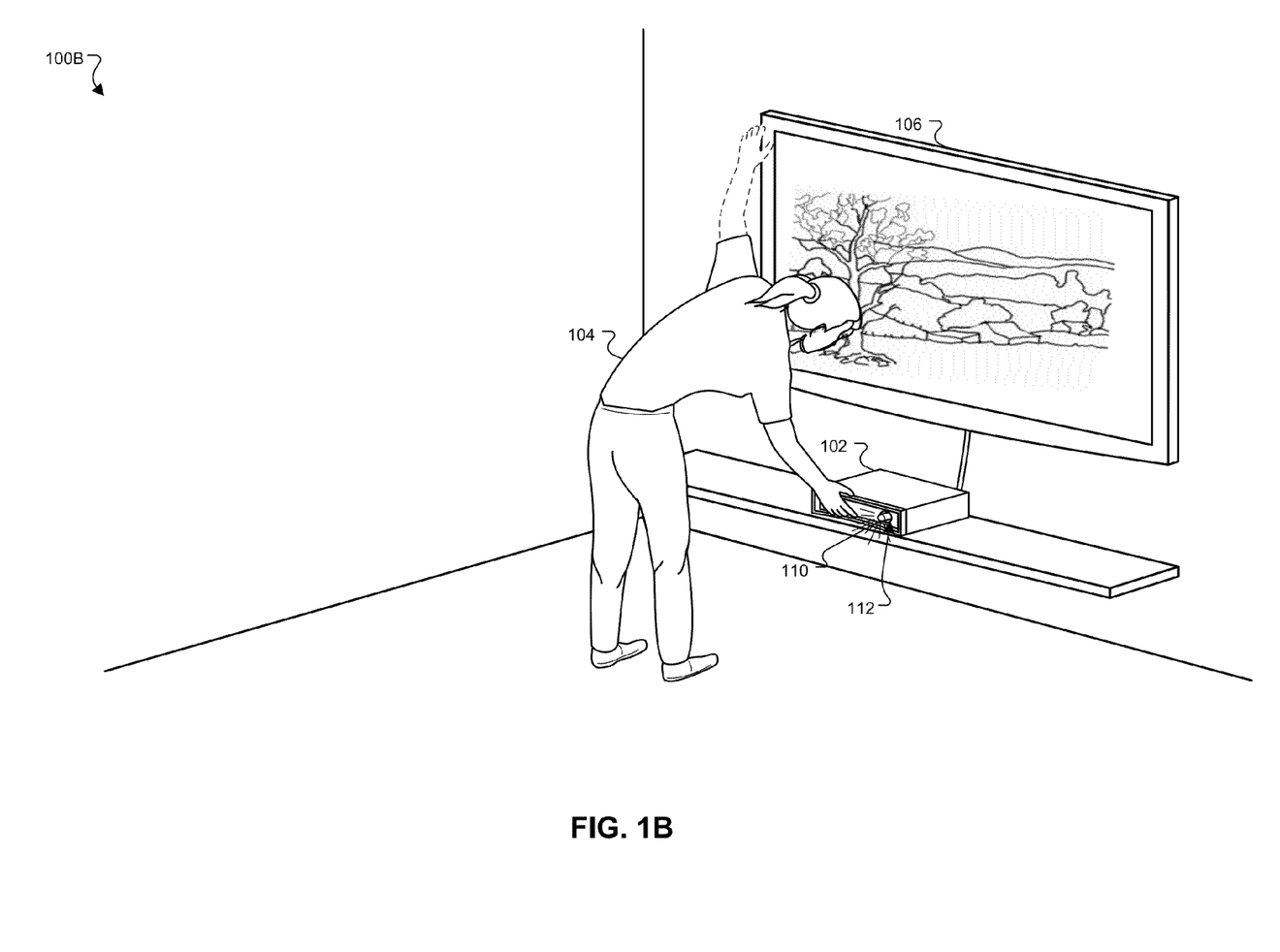

FIGS. 1A and 1B illustrate a conceptual diagram of an environment 100 for controlling an electronic device 102. Although the electronic device 102 is depicted external to a television 106, the device 102 can be integrated as a portion of the television 106. As such, traditional television components can be utilized by device 102, in some implementations.

As shown in FIG. 1A, the environment 100A includes a user 104 in the foreground interacting with the electronic device 102 and with the television 106 (which is another form of electronic device) in the background, via remote control 108. The user 104 can use the remote control 108 to control the electronic device 102. For example, the user 104 can select volume controls, channel controls, or other controls to cause the device 102 to execute functionality within device 102 or on television 106. The user can alternatively or simultaneously use the remote control 108 to control the television 106. As one example, the remote control 108 may be a programmable remote control that sends a signal on which the television 106 acts when a volume button is pressed, and sends a signal on which the device 102 acts when a channel button is pressed.

The electronic device 102 includes a sensor 110 and a light emitter, such as a light emitting diode (LED) 112. The sensor 110 may generally be located beside the emitter (which may be the LED 112 itself or a location at which light from the LED is otherwise emitted) when viewed from the front of the device 102. The sensor 110 can also be located in line with the LED 112. For example, the sensor 110 can be located directly behind the LED 112. However, in normal operation the sensor and emitter should be located, aimed, and shielded in a manner so that the sensor 110 does not trigger absent a physical, proximate user interaction with the device 102, such as by a user swiping a hand or other item in front of the emitter and the sensor 110 so as to cause light from the emitter to reflect off the item and be received by the sensor 110.

In general, the sensor 110 can detect a sub-carrier signal absence or presence based on infrared light rays bounced between objects and the LED 112, for example. Although only one sensor and LED are shown here, any appropriate number of sensors and/or LEDs can be implemented in electronic device 102. In addition, the sensors and LEDs can be arranged on device 102 in such a fashion as to monitor for several inputs at once (e.g., a user swiping an item in proximity to different locations on the device 102).

Other sensors can be implemented in electronic device 102. For example, a microphone device can be adaptively configured to sense a user's speech input or to reactively adjust a volume depending on detected noise within a room. In another example, an LED and sensor combination can be used to adapt to lighting changes in the room upon detecting room darkening or brightening. Using such additional sensors, a user can provide a combination input to the device 102. For example, a user may swipe her hand past sensor 110 in order to turn on voice input recognition for the device 102, and may subsequently speak additional commands to the device 102.

In some implementations, the electronic device 102 can be implemented as a stereo receiver connected to a sound system (not shown) and/or the television 106. In some implementations, the electronic device 102 is configured as a set-top box (e.g., a cable or satellite box) with one or more processors controlling output on the television 106. In some implementations, the electronic device 102 is configured as a gaming console for streaming video, playing games online, or otherwise accessing online resources.

In operation, the electronic device 102 can receive input in a variety of ways. For example, the electronic device 102 may have buttons, touch sensors, and switches that a user can activate manually by pressing, switching or moving such mechanisms. In some implementations, the electronic device 102 may be configured to receive commands from a remote controller, such as remote controller 108.

Referring now to FIG. 1B, an environment 100B is shown with the user 104 near the electronic device 102. In particular, the user 104 has moved up to the electronic device 102 and is shown leaning toward television 106 while placing a hand in front of device 102. (The user's left arm is shown in dashed form to indicate that the two actions could be performed separately, with sensors being located in only one of the devices, sensors in both devices but the user choosing to perform an action by coming in proximity with only one of the devices, or sensors in both devices but the sensors triggering different actions by the devices so that the user might have to come into proximity with sensors on both devices). Here, the electronic device 102 can detect the user's proximity to device 102 and interpret the detection as a specific input to sensor 110 and LED 112, for example. The specific input can be translated into a function which can be carried out on electronic device 102.

Detecting proximity of a user can include determining whether or not a light reflection is received at an input of the light emitter (e.g., LED 112) of the device. In particular, light from LED 112 can be detected at the sensor 110 if an item controlled by the user is placed within a short range of the electronic device 102. For example, the electronic device 102 can monitor input received at LED 112 for various types of received light (e.g., particular wavelengths, pulsing patterns, or the like), determine whether the received light is indicative or a generator in a remote control or a generator in the electronic device 102 itself, and react according to predetermined rules of which the user is aware (e.g., a hand swipe past a particular area results in a particular action when the device 102 is in a particular mode).

The electronic device may also determine an approximate distance between the item controlled by the user, and the electronic device 102, and can use the determined distance as a guide for which, if any functions to enable, disable, or perform. For example, the user 104 can place a hand or digit near the sensor 110 and the device 102 can detect that the input originated from the LED 112 rather than a remote controller. The device 102 can then perform a function based on the detection. For example, the electronic device 102 can execute a mute function or an unmute function of the volume functionality upon determining the user is proximate to the sensor 110 (e.g., a touch sensor) representing volume control. Each such separate activity of sensing can toggle the function also, so that a first hand swipe mutes an operating device 102, and a subsequent swipe unmutes it. In some implementations, a sensing activity can toggle an operating state of the electronic device 102. For example, upon sensing a user's nearness to sensor 110, device 102 may toggle from a playback state having content streaming and being presented to the user to a paused playback state with a freeze frame. This state can be maintained until user interaction with a sensed movement and/or upon receiving a remote control signal to change the operating state of the device.

In another example, the electronic device 102 can switch a mode of operation of the device 102 based on whether the signal is identified as originating from at least one LED on the device 102. Similarly, the electronic device 102 can detect that a remote controller originated a signal received at sensor 110 and can provide different functionality based on the detection. In some implementations, the electronic device 102 can simply change a channel on the device 102 upon determining where a particular input signal originated.

Figure 2A:
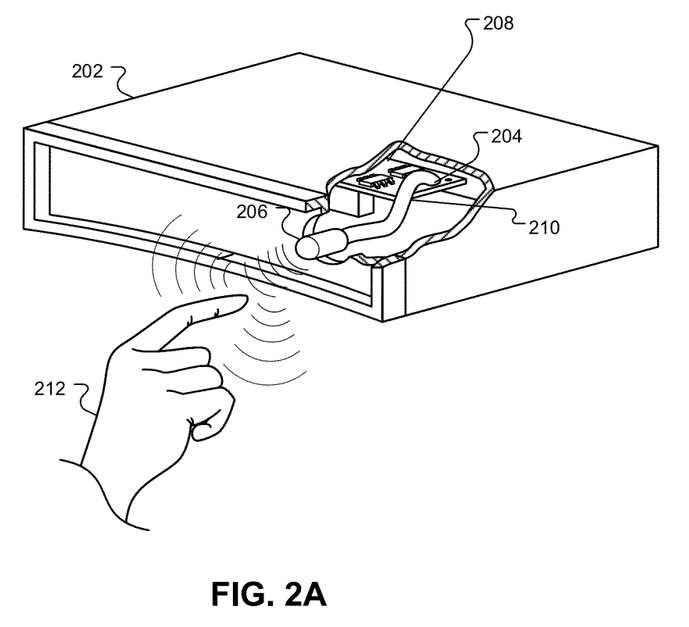
FIGS. 2A and 2B are perspective views of an electronic device.

Referring to FIG. 2A, a top perspective view of an electronic device 202 is depicted. The electronic device 202 includes an emitter 206 connected via a light pipe 210 to an LED 204 that is mounted on a circuit board 208. The circuit board 208 also provides a connection to one or more microprocessors, any or all of which can be used to carry out functions and algorithms which employ signals that are received by the device 202.

Separately, a sensor (not shown) may be placed adjacent to the emitter 206 (which may simply be a lens at the end of the light pipe 210, or in other embodiments could be an LED mounted at the face of the electronic device 202). The sensor may be connected to circuitry on the circuit board 208 also, so that when the sensor receives an input signal (e.g., an IR signal containing certain digital data), the input IR (or other electromagnetic signal) may be converted to a wired electrical signal and provided to a processor on the circuit board 208 for analysis and processing.

In some implementations, LED 204 is connected to the light pipe 210 extending from a viewing location (in front of 206) to the LED 204 light source. In some implementations, the emitter 206 can be located adjacent an input for the light sensor such that if a user physically covers the light emitter 206 with a single finger or hand, light from the emitter will be reflected off the user to the input for the light sensor. In some implementations, standing directly in front of the sensing location may be enough to trigger a reflection back to the sensor.

The emitter 206 in this example is shown with a user's hand 212 near the emitter 206, so that an adjacent sensor can detect proximity of the user's hand 212 (i.e., having a small distance from the device 102), as shown by the emanating electromagnetic waves. In some implementations, the emitter 206 is positioned and controlled to provide visual information to a user of the device 202, and to emit light to be detected by the light sensor.

The sensor can be a proximity sensor, such as a sensor that includes one or more light emitting diodes connected to a phototransistor in series with a power circuit, and thus may include both the emitter and the sensor in one package. In operation of the sensor, voltage is applied to the proximity sensor which in turn emits infrared light. The emitted light propagates through air until it dissipates or bounces off an object. Upon bouncing off of an object, such as a person, the propagating light is reflected back toward the sensor. If the object or person is relatively close to the sensor, the reflected light will be stronger than if the object is further away. Conversely, if the object or person is far away, the reflected light will be weaker or non-existent. However, if the reflected light provides a strong reflection, the proximity sensor will be activated. Upon activation of the proximity sensor, a corresponding signal will be sent to an output terminal, such as a remote controller. The output terminal can be used to activate any number of functions on electronic device 202 using the received signal.

In operation, the sensor and the LED can be used in an off position while monitoring incoming signals. Upon receiving a signal, the combination of the sensor and the LED can function as a dual mode proximity sensor to detect a source of a received input. For example, processors on device 202 can employ standard sensors and LEDs to trigger execution of system functions without modifying the hardware of device 202. Essentially, processors on device 202 can be configured with software to provide control of standard off-the-shelf hardware. In particular, such processors can be programmed to determine which of two or more input sources provided a signal. The determination can be used to change how the device 202 responds to different inputs.

In some implementations, a number of processors can function to coordinate control of the electronic device 202. For example, the sensor and LED can be controlled by separate processors that function together to coordinate control of the electronic device 202.

In some implementations, multiple LEDs can be deployed on electronic device 202, any or all of which can be controlled by one or more processors. For example, the sensor may be a light sensor to detect two or more input signals received at different frequencies, attached to a processor that is programmed to react differently to inputs at the different frequencies. The light sensors may be controlled by a single processor, in some implementations, such that if the sensor detects an infrared frequency that is standard for a remote controller device, a first processor can detect such a frequency and perform operations accordingly. Additional processors can be programmed to detect different frequencies outputted by other input devices. Alternatively, a single processor may be provided and different software subroutines may be executed based on the type of signal (e.g., reflection versus remote controller) that is received.

Figure 2B:
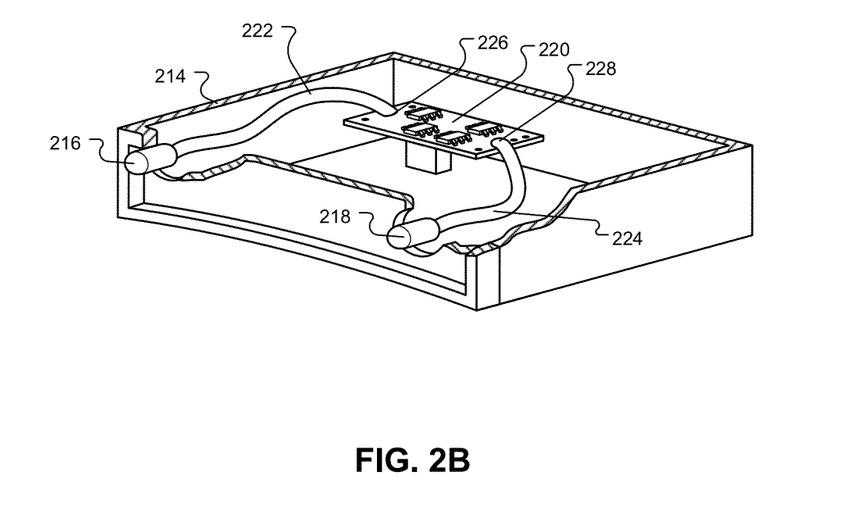

Referring to FIG. 2B, an electronic device 214 is shown with multiple LEDs 226 and 228. LED 226 is connected to circuit board 220, and feeds a combination emitter/sensor 216 via light pipe 222. Similarly, LED 228 is connected to circuit board 220, and feeds a combination emitter/sensor 218 via light pipe 224. Each LED 226, 228 may be connected to corresponding emitter/sensors 216 and 218, respectively. In some implementations, LED devices 226, 228 can be connected to a single LED that provides light for both emitter/sensors 216, 218.

The electronic device 214 can be configured to trigger particular functionality depending on where a user provides input. For example, if a user blocks emitter/sensor 218 with a hand, a corresponding action may be triggered to carry out device functionality. For example, blocking or partially occluding emitter/sensor 218 can indicate that the user wishes to mute or unmute audio playback on the device 214. By contrast, if the user were to block or partially occlude emitter/sensor 216, the device 214 may interpret that the user wishes to carry out another task such as switching a wireless Internet connection on or off. Both emitter/sensors 216, 218 can be used for these separate functions upon detecting proximity and can do so simultaneously. In addition, the emitter/sensors 216, 218 can be used to execute different device functions based on the type of received input. For example, if one or both LEDs detects a remote controller input, rather than a manually entered input or a sensed proximity input, the processors on the electronic device can be programmed to perform a different function of the device unrelated to remote control signal input.

In some implementations, the electronic device 214 includes screen-printed overlays near the emitter/sensors 216, 218 to indicate a particular function of the device 214 that will be performed based on bringing an item in proximity to those areas. For example, a volume signal may be placed next to emitter/sensor 216 and a power signal may be placed next to emitter/sensor 218. The screen printed overlays can, in some implementations, indicate a sensor position so the user understands how to interact with the sensors on the device 214.

In some implementations, one LED device may include a proximity sensor to detect the closeness of a user. If a particular threshold is met, the sensor can trigger the electronic device 214 to toggle an on/off switch. That is, the sensor can be configured to detect a presence near an electronic device and turn on the device upon detecting such a presence (and upon the reflection of light reaching a threshold level, so that the device 214 does not trigger via casual motion around it, such as a user walking past the device 214).

Figure 3:
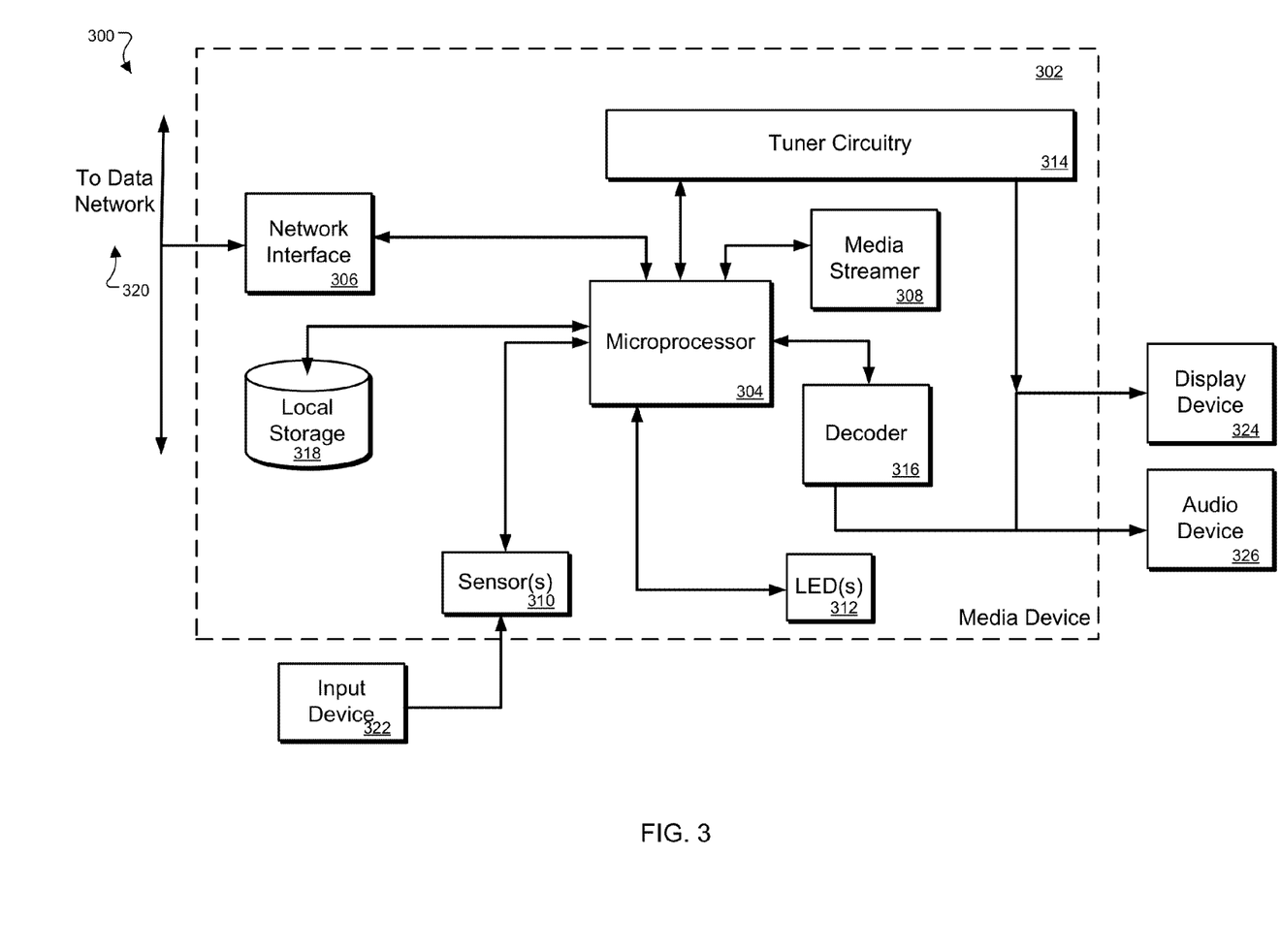
FIG. 3 is a schematic diagram of a media device that can respond to proximity-based input in addition to remote control input

FIG. 3 is a schematic diagram of a media device 302 that can respond to proximity-based input in addition to remote control input. As shown, the media device 302 includes a microprocessor 304, a network interface 306, a media streamer 308, sensors 310, light emitting diodes (LEDs) 312, tuning circuitry 314, and a decoder 316. The microprocessor 304 is a controller that can be programmed to obtain signals from a light sensor (e.g., sensors 310) and determine whether an input to the light sensor was produced by a light emitter (e.g., LED 312) or from a different light emitter that is not part of the electronic device. In addition, the microprocessor 304 controls system functions, interacts with the network interface 306 and organizes the output of display and audio from the media device 302. In some implementations, the microprocessor 304 is programmed to determine that an input to one or more light sensor (e.g., sensors 310) was produced by a light emitter that is not part of the media device 302. For example, the microprocessor 304 can determine that a characteristic of the received input matches one or more known characteristics for a standard infrared remote controller. Similarly, the microprocessor 304 can determine that a characteristic of the received input matches one or more known characteristics for a standard infrared light emitter, for example. The microprocessor 304 can use the matched characteristic in either event to process the signal and carry out appropriate device functions.

The media streamer 308 provides one or more sequences of computer executable instructions for performing various functions for the media device 302. As is typical, the instructions may be stored on a nonvolatile memory of the media device 302 in, for example, a hard disk, flash memory, repository 318, or firmware of media device 302. Alternatively, instructions may be read by the media device 302 from a removable non-volatile computer-readable storage medium (e.g., a Blu-ray Disc). In some implementations, all or a portion of instructions for providing media streamer 308 media content can be received over data network 320 via network interface 306.

The network interface 306 and data network 320 may be represented by an Ethernet port configured to couple the media device 302 to a router, hub, DSL modem, or cable modem. In some implementations, the combination of the network interface 306 and the data network 320 may be represented by an Ethernet port configured to couple the media device 302 to a wireless access point, hotspot, or another source of audiovisual program data.

The sensors 310 can include one or more light sensors coupled to the microprocessor 304. In some implementations, the sensors 310 represent infrared sensors. The infrared sensors in device 302 can be light sensors configured to determine object or user proximities. Other sensors can be present on electronic device 102.

The tuner circuitry 314 can include a number of components to convert radio frequency transmissions into audio and video signals. For example, the tuner circuitry 314 can include a tuner (not shown), a detector (not shown), an amplifier (not shown), or other tuning components. The tuner circuitry 314 can be deployed as part of the media device 302 or in some implementations; such circuitry can be deployed as part of a connected device, such as a television. In some implementations, tuner circuitry 314 can include a radio tuner for tuning radio broadcasts.

The decoder 316 may include any appropriate combination of subcomponents such as a buffer for queuing data in an audio/video stream file, a de-multiplexer for de-multiplexing data in the stream file into separate elementary audio and video streams, and an audio decoder and a video decoder for decompressing audio and video streams respectively.

Local storage 318 generally includes a hard disk or flash memory for storing files; including playlists, user data, and audio/video stream files downloaded from data network 320 by the media device 302.

The environment 300 is configured to receive user input from one or more input devices 322. Input devices 322 can include, but are not limited to, remote controllers, hard-wired controllers, and/or physical contact (e.g., user touch or sensed presence). In operation, sensors 310 can receive input from input device 322 and microprocessor 304 can translate the received input into executable functions. For example, an input or input signal can be received at a sensor 310, processed by microprocessor 304 and may result in an event notification to a program or process executing instructions included in media streamer 308.

Input received from input device 322 can be outputted to a display device 324 and an audio device 326. In some implementations, microprocessor 304, decoder 316, and/or tuning circuit 314 can perform operations on the input before producing output to display device 324 and audio device 326.

In operation, a signal is received from an input device 322. The signal can be received through a light sensor, such as sensor 310 on device 302, and processed by the microprocessor 304. For example, an input from a remote controller device can be received through the sensor 310 and processed by the microprocessor 304. The processing may include identifying whether the received signal originated from a light emitter of the device, such as LED 312 or from a light emitter that is separate from the device, such as a remote controller. Upon determining which device provided the input signal, the environment 300 can control a function of the media device 302. The controlled function can be selected by the microprocessor 304 based on whether the signal is identified as originating from the light emitter of the device or the light emitter separate from the device. The particular function can be carried out using tuner circuitry 314, media streamer 308, decoder 316, local storage 318, and/or network resources via network interface 306, for example. Any output generated by the controlled function can be provided at display device 324 and/or audio device 326.

In some implementations, the processing may include decoding a received signal based on whether the signal is identified as originating from the light emitter of the device or the light emitter that is separate from the device. For example, if it is determined that the signal originated from the light emitter of the device, the microprocessor 304 can enable the decoder 316 to expect the signal at a particular frequency. If, however, it is determined that the signal originated from the light emitter of a remote device, for example, the microprocessor 304 can enable the decoder 316 to expect a signal at a different frequency.

Figure 4:
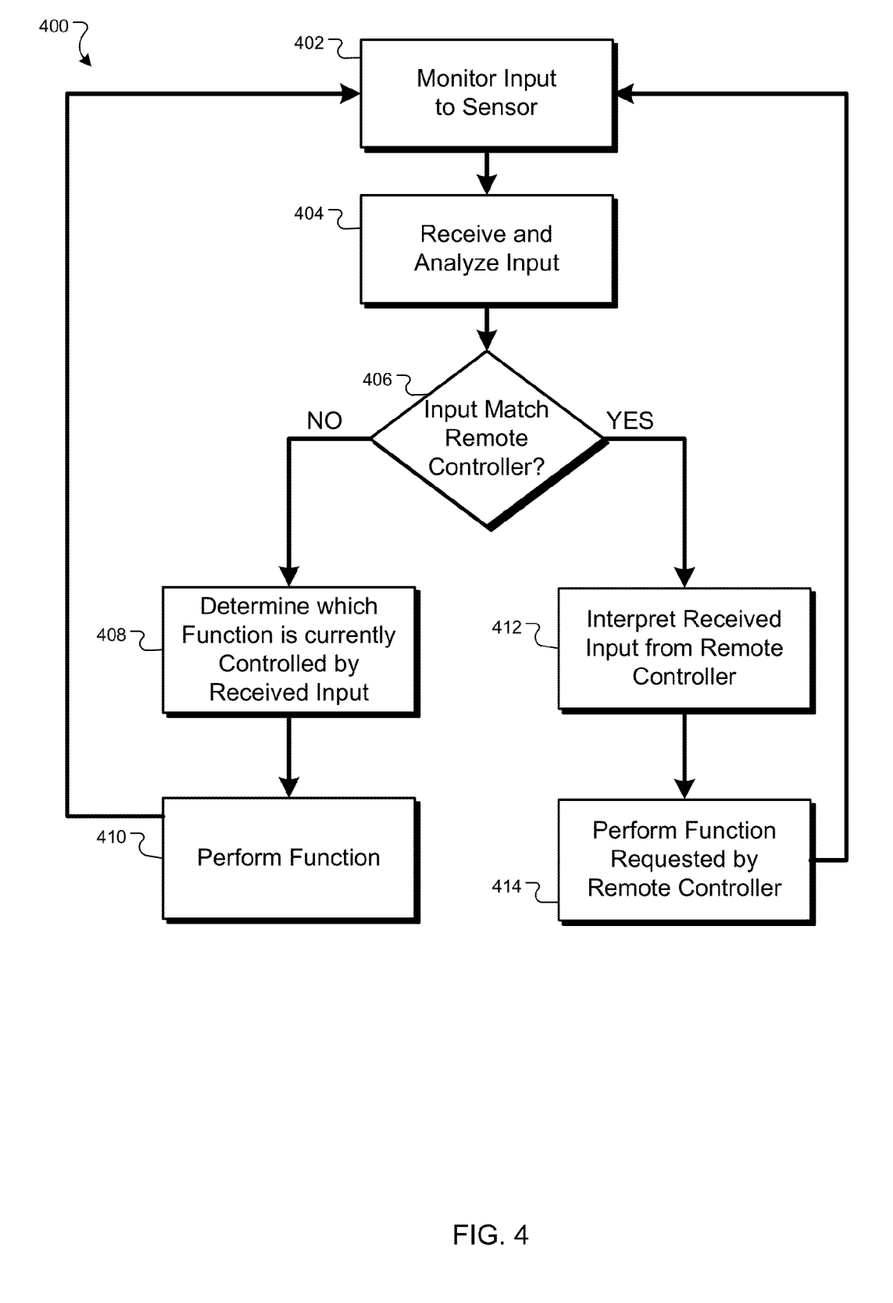
FIG. 4 is a flowchart showing actions performed by a processor to determine an origin for an input signal.

FIG. 4 is a flowchart 400 showing actions performed by a processor (e.g., microprocessor 304) to determine an origin for an input signal and to act on the signal. In general, the flowchart 400 shows actions made by one or more processors in an electronic product in response to sensing circuitry, as described above. At box 402, the processor monitors input to a sensor. For example, the processor can monitor a signal from a user or external device to a light sensor on the electronic device.

At some point, the processor receives and analyzes input, at box 404. For example, the processor receives a signal through the light sensor 310 on the electronic device, such as media device 302. In some implementations, the received signal is a touch input at the electronic device, which is sensed by receiving light at a particular frequency (that matches a frequency of light emitted by a part of the device). In some implementations, the received signal is an infrared remote controller signal received at the electronic device. In some electronic devices, the signal received is a wirelessly transmitted signal transmitted from an external device to the electronic device.

Upon receiving the input, the processor determines whether or not the input was originated from a light emitter 312 of the electronic device or from a light emitter that is separate from the device (e.g., a remote controller). For example, the processor identifies whether the received signal originated from an LED (e.g., light emitter) 312 of the electronic device or from a remote controller external to the device.

If the processor determines that the input was originated from the light emitter 312 of the electronic device, the processor determines which function is controlled by the received signal, at box 408. For example, a sensor 310 on the electronic device 302 can detect that a user placed a hand near the LED light emitter 312. The device may be programmed to respond to the received input by muting or unmuting audio for a television, for example.

Upon determining that the signal input was provided by a user's proximity and determining which function is controlled by the type of received input, the processor executes the function, at box 410. In some implementations, determining that the signal input was provided by a user's input includes decoding the received signal at the LED device. In some implementations, the processor can select a function to be performed based upon whether an input to the light sensor was produced by the light emitter.

If the processor determines that the input originated from a remote controller, the processor interprets the received input as remote controller input, at box 412, by decoding the received remote controller signal at the LED device 312, for example. Next, the processor performs the function requested by the remote controller, at box 414. For example, the processor performs a channel change or a movie selection as indicated by user-entered input on the remote controller. In general, the function performed when an input signal is received from a remote controller is a different function than the function performed when a user proximity or touch input is received by the electronic device regardless of whether the same sensor mechanism and/or light emitting mechanism were used to interpret the input signal.

In some implementations, the processor can implement a switching of a mode of operation of the electronic device based on whether the signal is identified as originating from the LED (e.g., light emitter) of the device or from the remote controller. For example, the processor can switch the mode of operation from an on position to an off position if a signal is received from a remote controller at sensor 310 of the electronic device 302. However, if a signal is instead received at the sensor 310 from a touch input near the device 302, the processor can switch from a non-muted mode to a muted mode instead of turning on or off the device. Thus, the system can react to the user's environment in a more desirable manner using the same sensing hardware already available on the device.

Figure 5:
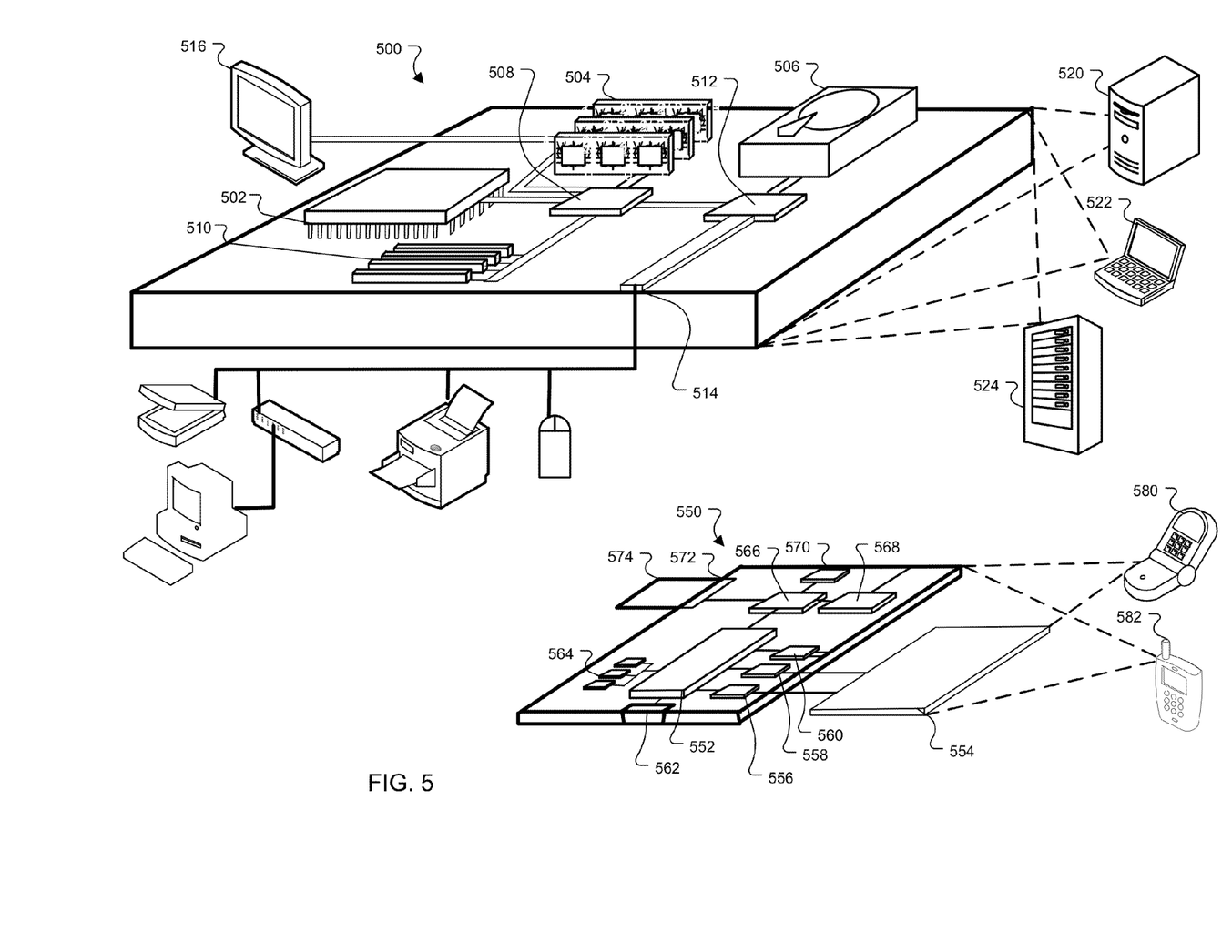
FIG. 5 is an example of a computer device and a mobile computer device.

FIG. 5 is a block diagram of computing devices 500, 550 that may be used to implement the systems and methods described in this document, as either a client or as a server or plurality of servers. Computing device 500 is intended to represent various forms of digital computers, such as laptops, desktops, workstations, personal digital assistants, servers, blade servers, mainframes, and other appropriate computers. Computing device 550 is intended to represent various forms of mobile devices, such as personal digital assistants, cellular telephones, smartphones, and other similar computing devices. Additionally computing device 500 or 550 can include Universal Serial Bus (USB) flash drives. The USB flash drives may store operating systems and other applications. The USB flash drives can include input/output components, such as a wireless transmitter or USB connector that may be inserted into a USB port of another computing device. The components shown here, their connections and relationships, and their functions, are meant to be exemplary only, and are not meant to limit implementations of the inventions described and/or claimed in this document.

Computing device 500 includes a processor 502, memory 504, a storage device 506, a high-speed interface 508 connecting to memory 504 and high-speed expansion ports 510, and a low speed interface 512 connecting to low speed bus 514 and storage device 506. Each of the components 502, 504, 506, 508, 510, and 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as display 516 coupled to high speed interface 508. In other implementations, multiple processors and/or multiple buses may be used, as appropriate, along with multiple memories and types of memory. Also, multiple computing devices 500 may be connected, with each device providing portions of the necessary operations (e.g., as a server bank, a group of blade servers, or a multi-processor system).

The memory 504 stores information within the computing device 500. In one implementation, the memory 504 is a volatile memory unit or units. In another implementation, the memory 504 is a non-volatile memory unit or units. The memory 504 may also be another form of computer-readable medium, such as a magnetic or optical disk.

The storage device 506 is capable of providing mass storage for the computing device 500. In one implementation, the storage device 506 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 504, the storage device 506, or memory on processor 502.

The high speed controller 508 manages bandwidth-intensive operations for the computing device 500, while the low speed controller 512 manages lower bandwidth-intensive operations. Such allocation of functions is exemplary only. In one implementation, the high-speed controller 508 is coupled to memory 504, display 516 (e.g., through a graphics processor or accelerator), and to high-speed expansion ports 510, which may accept various expansion cards (not shown). In the implementation, low-speed controller 512 is coupled to storage device 506 and low-speed expansion port 514. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. It may also be implemented as part of a rack server system 524. In addition, it may be implemented in a personal computer such as a laptop computer 522. Alternatively, components from computing device 500 may be combined with other components in a mobile device (not shown), such as device 550. Each of such devices may contain one or more of computing device 500, 550, and an entire system may be made up of multiple computing devices 500, 550 communicating with each other.

Computing device 550 includes a processor 552, memory 564, an input/output device such as a display 554, a communication interface 566, and a transceiver 568, among other components. The device 550 may also be provided with a storage device, such as a microdrive or other device, to provide additional storage. Each of the components 550, 552, 564, 554, 566, and 568, are interconnected using various buses, and several of the components may be mounted on a common motherboard or in other manners as appropriate.

The processor 552 can execute instructions within the computing device 550, including instructions stored in the memory 564. The processor may be implemented as a chipset of chips that include separate and multiple analog and digital processors. Additionally, the processor may be implemented using any of a number of architectures. For example, the processor 410 may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 550, such as control of user interfaces, applications run by device 550, and wireless communication by device 550.

Processor 552 may communicate with a user through control interface 558 and display interface 556 coupled to a display 554. The display 554 may be, for example, a TFT (Thin-Film-Transistor Liquid Crystal Display) display or an OLED (Organic Light Emitting Diode) display, or other appropriate display technology. The display interface 556 may comprise appropriate circuitry for driving the display 554 to present graphical and other information to a user. The control interface 558 may receive commands from a user and convert them for submission to the processor 552. In addition, an external interface 562 may be provide in communication with processor 552, so as to enable near area communication of device 550 with other devices. External interface 562 may provide, for example, for wired communication in some implementations, or for wireless communication in other implementations, and multiple interfaces may also be used.

The memory 564 stores information within the computing device 550. The memory 564 can be implemented as one or more of a computer-readable medium or media, a volatile memory unit or units, or a non-volatile memory unit or units. Expansion memory 574 may also be provided and connected to device 550 through expansion interface 572, which may include, for example, a SIMM (Single In Line Memory Module) card interface. Such expansion memory 574 may provide extra storage space for device 550, or may also store applications or other information for device 550. Specifically, expansion memory 574 may include instructions to carry out or supplement the processes described above, and may include secure information also. Thus, for example, expansion memory 574 may be provide as a security module for device 550, and may be programmed with instructions that permit secure use of device 550. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552 that may be received, for example, over transceiver 568 or external interface 562.

Device 550 may communicate wirelessly through communication interface 566, which may include digital signal processing circuitry where necessary. Communication interface 566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 568. In addition, short-range communication may occur, such as using a Bluetooth, WiFi, or other such transceiver (not shown). In addition, GPS (Global Positioning System) receiver module 570 may provide additional navigation- and location-related wireless data to device 550, which may be used as appropriate by applications running on device 550.

Device 550 may also communicate audibly using audio codec 560, which may receive spoken information from a user and convert it to usable digital information. Audio codec 560 may likewise generate audible sound for a user, such as through a speaker, e.g., in a handset of device 550. Such sound may include sound from voice telephone calls, may include recorded sound (e.g., voice messages, music files, etc.) and may also include sound generated by applications operating on device 550.

The computing device 550 may be implemented in a number of different forms, as shown in the figure. For example, it may be implemented as a cellular telephone 580. It may also be implemented as part of a smartphone 582, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), peer-to-peer networks (having ad-hoc or static members), grid computing infrastructures, and the Internet.

The computing system can include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. In addition, the logic flows depicted in the figures do not require the particular order shown, or sequential order, to achieve desirable results. Other steps may be provided, or steps may be eliminated, from the described flows, and other components may be added to, or removed from, the described systems. Accordingly, other implementations are within the scope of the following claims.

What is claimed is:

1. A computer-implemented method for controlling an electronic device, the method comprising:
receiving a signal through a light sensor of the electronic device;

identifying with a processor of the electronic device whether the received signal originated from a light emitter that is part of the electronic device or instead from a light emitter that is not part of the electronic device, wherein identifying the signal origination comprises determining a propagation strength and a frequency of the received signal, and comparing the propagation strength and the frequency to known characteristics for: (i) the light emitter that is part of the electronic device and (ii) the light emitter that is not part of the electronic device; and controlling a function of the electronic device, the function selected based at least in part on whether the signal is identified as originating from the light emitter that is part of the electronic device or instead from the light emitter that is not part of the electronic device.

2. The method of claim 1, further comprising:
decoding the received signal based on whether the signal is identified as originating from the light emitter that is part of the electronic device or instead from a light emitter that is not part of the electronic device.

3. The method of claim 1, wherein the identifying further comprises determining whether or not a light reflection is received at an input of the light emitter of the electronic device.

4. The method of claim 1, wherein controlling a function of the electronic device comprises muting or unmuting sound that is caused by the electronic device.

5. The method of claim 1, wherein controlling a function of the device comprises changing a television channel using the electronic device.

6. An electronic device having an electronic control system, the electronic control system comprising:
a light emitter that is part of the electronic device;
a light sensor that is part of the electronic device; and
a controller in the electronic device that is programmed to obtain signals from the light sensor and to select a function to be performed by the electronic device, wherein selecting the function to be performed depends on a determination of whether an input to the light sensor was produced by the light emitter that is part of the electronic device or instead from a light emitter that is not part of the electronic device;
wherein the determination of whether the input to the light sensor was produced by the light emitter that is part of the electronic device or instead from the light emitter that is not part of the electronic device comprises determining a propagation strength and a frequency of the obtained signals, and comparing the propagation strength and the frequency to known characteristics for: (i) the light emitter that is part of the electronic device and (ii) the light emitter that is not part of the electronic device.

7. The system of claim 6, wherein the light emitter that is part of the electronic device generates infrared light, and the light sensor comprises an infrared sensor.

8. The system of claim 6, wherein the controller is programmed to determine that the input to the light sensor was produced by the light emitter that is part of the electronic device by determining that a characteristic of the input matches one or more known characteristic for standard infrared light emitters.

9. The system of claim 6, wherein an output for the light emitter that is part of the electronic device is located physically adjacent an input for the light sensor such that if a user physically covers the light emitter with a hand, light from the emitter will be reflected off the user to the input for the light sensor.

10. The system of claim 6, wherein the light emitter that is part of the electronic device comprises a light emitting diode positioned and controlled to provide visual information to a user of the electronic device, and to emit light to be detected by the light sensor.

11. The system of claim 10, wherein the light emitting diode is connected to a light pipe that extends from the light emitting diode to a location where a user can view light from the light emitting diode.

12. The system of claim 11, wherein the sensing location comprises a location on the electronic device where a user can place an object to create a reflection of light from the light emitting diode to be sensed by the light sensor.

13. The system of claim 6, wherein a processor that receives information from the light sensor is programmed to distinguish between signals from two or more different electronic devices.

14. A computer-implemented method for controlling an electronic device, the method comprising:
monitoring, with a processor of the electronic device, a signal sensed by a light sensor of the electronic device;
receiving a first signal and a second signal through the light sensor;
identifying that the first signal originated from a light emitter that is part of the electronic device and the second signal originated from a remote controller wherein identifying the originations comprises determining a propagation strength and a frequency of the first and the second received signals, and comparing the propagation strengths and the frequencies to known characteristics for: (i) the light emitter that is part of the electronic device and (ii) a light emitter that is part of the remote controller; and
selecting respective functions to perform in response to receiving the first signal and the second signal, based on identifying originations of the signals.

15. The method of claim 14, wherein the identifying comprises decoding the received signal.

16. The method of claim 14, wherein the first signal is generated by reflection off an item placed by a user of the device so as to reflect light from the light emitter to the sensor.

17. The method of claim 14, further comprising decoding the first and second signals based on whether the respective signal is identified as originating from the light emitter of the device or from the remote controller.

18. A system comprising:
one or more processors and one or more storage devices storing instructions that are operable, when executed by the one or more processors, to cause the one or more processors to perform operations comprising:
receiving a signal through a light sensor of the electronic device;
identifying with a processor of the electronic device whether the received signal originated from a light emitter that is part of the electronic device or instead from a light emitter that is not part of the electronic device, wherein identifying the signal origination comprises determining a propagation strength and a frequency of the received signal, and comparing the propagation strength and the frequency to known characteristics for: (i) the light emitter that is part of the electronic device and (ii) the light emitter that is not part of the electronic device;

controlling a function of the electronic device, the function selected based at least in part on whether the signal is identified as originating from the light emitter that is part of the electronic device or instead from the light emitter that is not part of the electronic device.

19. The system of claim 18, wherein the operations further comprise decoding the received signal based on whether the signal is identified as originating from the light emitter that is part of the electronic device or the light emitter that is not part of the electronic device.

20. The system of claim 18, wherein the identifying further comprises determining if a user is proximate to the electronic device by determining whether or not a light reflection is received at an input of the light emitter that is part of the electronic device.

* * * * *